United States Patent
Kim et al.

(10) Patent No.: US 7,633,144 B1
(45) Date of Patent: Dec. 15, 2009

(54) SEMICONDUCTOR PACKAGE

(75) Inventors: Youn Sang Kim, Gyeonggi-do (KR);
Bong Chan Kim, Gyeonggi-do (KR);
Yoon Joo Kim, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 290 days.

(21) Appl. No.: 11/440,662

(22) Filed: May 24, 2006

(51) Int. Cl.
*H01L 21/56* (2006.01)
(52) U.S. Cl. .................. 257/678; 257/687; 257/723; 257/E21.504
(58) Field of Classification Search .......... 257/E21.504, 257/687, 723, 678
See application file for complete search history.

(56) References Cited

U.S. PATENT DOCUMENTS

| | | | |
|---|---|---|---|
| 3,880,528 A | 4/1975 | Petersen et al. ............. 356/225 |
| 4,055,761 A | 10/1977 | Shimomura ................. 250/239 |
| 4,491,865 A | 1/1985 | Danna et al. .................. 358/98 |
| 4,567,643 A | 2/1986 | Droguet et al. ............... 29/575 |
| 4,763,188 A | 8/1988 | Johnson |
| 4,896,217 A | 1/1990 | Miyazawa et al. ...... 358/213.11 |
| 4,947,234 A | 8/1990 | Einzinger et al. ............. 357/68 |
| 4,999,142 A | 3/1991 | Fukushima et al. .......... 264/1.7 |
| 5,012,323 A | 4/1991 | Farnworth |
| 5,023,442 A | 6/1991 | Taniguchi et al. ........ 250/208.1 |
| 5,025,306 A | 6/1991 | Johnson et al. |
| 5,068,713 A | 11/1991 | Toda ........................... 357/72 |
| 5,122,861 A | 6/1992 | Tamura et al. ................ 357/74 |
| 5,220,198 A | 6/1993 | Tsuji .......................... 257/731 |
| 5,274,456 A | 12/1993 | Izumi et al. ................. 358/209 |
| 5,291,061 A | 3/1994 | Ball ........................... 257/686 |
| 5,323,060 A | 6/1994 | Fogal et al. ................. 257/777 |
| 5,328,079 A * | 7/1994 | Mathew et al. ........... 228/180.5 |
| 5,347,429 A | 9/1994 | Kohno et al. |
| 5,365,101 A | 11/1994 | Tonai ......................... 257/434 |
| 5,383,034 A | 1/1995 | Imamura et al. ............ 358/474 |
| 5,400,072 A | 3/1995 | Izumi et al. ................. 348/335 |
| 5,412,229 A | 5/1995 | Kuhara et al. ............... 257/183 |
| 5,422,435 A | 6/1995 | Takiar et al. |
| 5,434,682 A | 7/1995 | Imamura et al. ............ 358/474 |

(Continued)

FOREIGN PATENT DOCUMENTS

EP 0 503 201 9/1992

(Continued)

OTHER PUBLICATIONS

St. Amand et al., U.S. Appl. No. 11/356,921, entitled "Stacked electronic component package film-on-wire spacer", filed Feb. 17, 2006.

(Continued)

*Primary Examiner*—A. Sefer
*Assistant Examiner*—Allen L Parker
(74) *Attorney, Agent, or Firm*—Gunnison, McKay & Hodgson, L.L.P.; Serge J. Hodgson (57) ABSTRACT

Disclosed are a semiconductor package and a method of making the same. In the semiconductor package, a substrate and a semiconductor die are covered with and encapsulated by vertically pressing thermosetting resin having fluidity in a predetermined temperature range and denaturalizing itself in gel. Thus, it is possible to reduce a thickness of the semiconductor package and prevent wire sweeping.

15 Claims, 8 Drawing Sheets

U.S. PATENT DOCUMENTS

| | | | | |
|---|---|---|---|---|
| 5,436,492 | A | 7/1995 | Yamanaka | 257/433 |
| 5,444,520 | A | 8/1995 | Murano | 355/229 |
| 5,463,229 | A | 10/1995 | Takase et al. | 257/59 |
| 5,463,253 | A | 10/1995 | Waki et al. | |
| 5,489,995 | A | 2/1996 | Iso et al. | 358/483 |
| 5,495,398 | A | 2/1996 | Takiar et al. | |
| 5,502,289 | A | 3/1996 | Takiar et al. | |
| 5,523,608 | A | 6/1996 | Kitaoka et al. | 257/433 |
| 5,570,204 | A | 10/1996 | Kumashiro | 358/471 |
| 5,581,094 | A | 12/1996 | Hara et al. | 257/80 |
| 5,604,362 | A | 2/1997 | Jedlicka et al. | 257/233 |
| 5,617,131 | A | 4/1997 | Murano et al. | 347/233 |
| 5,655,189 | A | 8/1997 | Murano | 399/220 |
| 5,672,902 | A | 9/1997 | Hatanaka et al. | 257/431 |
| 5,689,135 | A | 11/1997 | Ball | |
| 5,696,031 | A | 12/1997 | Wark | |
| 5,715,147 | A | 2/1998 | Nagano | |
| 5,721,452 | A | 2/1998 | Fogal et al. | |
| 5,739,581 | A | 4/1998 | Chillara et al. | |
| 5,783,815 | A | 7/1998 | Ikeda | 250/208.1 |
| 5,804,827 | A | 9/1998 | Akagawa et al. | 250/370.06 |
| 5,811,799 | A | 9/1998 | Wu | 250/239 |
| 5,815,372 | A | 9/1998 | Gallas | |
| 5,821,532 | A | 10/1998 | Beaman et al. | 250/239 |
| 5,825,560 | A | 10/1998 | Ogura et al. | 359/822 |
| 5,861,654 | A | 1/1999 | Johnson | 257/433 |
| 5,866,949 | A | 2/1999 | Schueller | |
| 5,886,412 | A | 3/1999 | Fogal et al. | |
| 5,888,606 | A | 3/1999 | Senoo et al. | 428/66.6 |
| 5,894,380 | A | 4/1999 | Sasada et al. | 360/103 |
| 5,902,993 | A | 5/1999 | Okushiba et al. | 250/208.1 |
| 5,904,497 | A | 5/1999 | Akram | 438/106 |
| 5,932,875 | A | 8/1999 | Chung et al. | 250/239 |
| 5,952,725 | A | 9/1999 | Ball | |
| 5,973,403 | A | 10/1999 | Wark | |
| 5,998,878 | A | 12/1999 | Johnson | 257/797 |
| 6,005,778 | A | 12/1999 | Spielberger et al. | |
| 6,011,294 | A | 1/2000 | Wetzel | 257/434 |
| 6,011,661 | A | 1/2000 | Weng | 359/819 |
| 6,013,948 | A | 1/2000 | Akram et al. | |
| 6,020,582 | A | 2/2000 | Bawolek et al. | 250/208.1 |
| RE36,613 | E | 3/2000 | Ball | |
| 6,037,655 | A | 3/2000 | Philbrick et al. | 257/680 |
| 6,051,886 | A | 4/2000 | Fogal et al. | |
| 6,057,598 | A | 5/2000 | Payne et al. | |
| 6,060,722 | A | 5/2000 | Havens et al. | 250/566 |
| 6,072,232 | A | 6/2000 | Li et al. | 257/680 |
| 6,072,243 | A | 6/2000 | Nakanishi | |
| 6,080,264 | A | 6/2000 | Ball | |
| 6,084,297 | A * | 7/2000 | Brooks et al. | 257/698 |
| 6,118,176 | A | 9/2000 | Tao et al. | |
| 6,122,009 | A | 9/2000 | Ueda | 348/335 |
| 6,130,448 | A | 10/2000 | Bauer et al. | 257/222 |
| 6,133,637 | A | 10/2000 | Hikita et al. | |
| 6,140,149 | A | 10/2000 | Wark | |
| 6,147,389 | A | 11/2000 | Stern et al. | 257/434 |
| 6,153,927 | A | 11/2000 | Raj et al. | 257/680 |
| 6,157,080 | A * | 12/2000 | Tamaki et al. | 257/738 |
| 6,163,076 | A | 12/2000 | Lee et al. | |
| 6,184,514 | B1 | 2/2001 | Rezende et al. | 250/208.1 |
| 6,214,641 | B1 | 4/2001 | Akram | |
| 6,215,193 | B1 | 4/2001 | Tao et al. | |
| 6,252,305 | B1 | 6/2001 | Lin et al. | |
| 6,258,626 | B1 | 7/2001 | Wang et al. | |
| 6,316,838 | B1 | 11/2001 | Ozawa et al. | |
| 6,326,696 | B1 | 12/2001 | Horton et al. | |
| 6,333,562 | B1 | 12/2001 | Lin | |
| 6,339,255 | B1 | 1/2002 | Shin | 257/686 |
| 6,340,846 | B1 | 1/2002 | LoBianco et al. | 257/783 |
| 6,351,028 | B1 | 2/2002 | Akram | 257/686 |
| 6,359,340 | B1 | 3/2002 | Lin et al. | |
| 6,365,966 | B1 | 4/2002 | Chen et al. | |
| 6,380,615 | B1 | 4/2002 | Park et al. | 257/686 |
| 6,384,397 | B1 | 5/2002 | Takiar et al. | 250/208.1 |
| 6,384,472 | B1 | 5/2002 | Huang | 257/680 |
| 6,387,728 | B1 | 5/2002 | Pai et al. | |
| 6,388,313 | B1 | 5/2002 | Lee et al. | 257/686 |
| 6,392,703 | B1 | 5/2002 | Uchino et al. | 348/373 |
| 6,414,381 | B1 | 7/2002 | Takeda | 257/676 |
| 6,437,449 | B1 | 8/2002 | Foster | |
| 6,461,897 | B2 | 10/2002 | Lin et al. | |
| 6,472,758 | B1 | 10/2002 | Glenn et al. | 257/777 |
| 6,476,475 | B1 | 11/2002 | Lee | |
| 6,498,624 | B1 | 12/2002 | Ogura et al. | 348/335 |
| 6,500,698 | B2 | 12/2002 | Shin | 438/112 |
| 6,503,776 | B2 | 1/2003 | Pai et al. | 438/106 |
| 6,509,560 | B1 | 1/2003 | Glenn et al. | 250/239 |
| 6,518,656 | B1 | 2/2003 | Nakayama et al. | 257/680 |
| 6,531,784 | B1 | 3/2003 | Shim et al. | |
| 6,545,365 | B2 | 4/2003 | Kondo et al. | 257/777 |
| 6,552,416 | B1 | 4/2003 | Foster | |
| 6,555,917 | B1 | 4/2003 | Heo | 257/777 |
| 6,559,526 | B2 | 5/2003 | Lee et al. | 257/676 |
| 6,576,997 | B2 | 6/2003 | Uchida | 257/723 |
| 6,593,662 | B1 | 7/2003 | Pu et al. | 257/777 |
| 6,603,072 | B1 | 8/2003 | Foster et al. | |
| 6,620,651 | B2 | 9/2003 | He et al. | 438/113 |
| 6,621,156 | B2 | 9/2003 | Kimura | 257/686 |
| 6,627,480 | B2 | 9/2003 | Kim | 438/109 |
| 6,627,864 | B1 | 9/2003 | Glenn et al. | 250/208.1 |
| 6,627,872 | B1 | 9/2003 | FuKamura et al. | 250/239 |
| 6,650,019 | B2 | 11/2003 | Glenn et al. | 257/777 |
| 6,657,290 | B2 | 12/2003 | Fukui et al. | 257/686 |
| 6,710,455 | B2 | 3/2004 | Goller et al. | 257/777 |
| 6,713,857 | B1 * | 3/2004 | Tsai | 257/686 |
| 6,730,543 | B2 | 5/2004 | Akram | 438/109 |
| 6,737,299 | B1 | 5/2004 | Jiang | 438/109 |
| 6,762,796 | B1 | 7/2004 | Nakajoh et al. | 348/340 |
| 6,767,753 | B2 | 7/2004 | Huang | 438/25 |
| 6,798,049 | B1 * | 9/2004 | Shin et al. | 257/678 |
| 6,833,287 | B1 | 12/2004 | Hur et al. | 438/107 |
| 6,838,761 | B2 * | 1/2005 | Karnezos | 257/685 |
| 6,849,950 | B1 | 2/2005 | Matsuura | 257/777 |
| 6,857,470 | B2 | 2/2005 | Park et al. | 165/185 |
| 6,867,438 | B1 | 3/2005 | Maruyama et al. | 257/184 |
| 6,894,380 | B2 | 5/2005 | Jiang et al. | 257/686 |
| 6,911,723 | B2 | 6/2005 | Akram | 257/686 |
| 6,977,439 | B2 | 12/2005 | Kang et al. | 257/777 |
| 7,176,558 | B2 | 2/2007 | Kang et al | 257/676 |
| 7,205,651 | B2 | 4/2007 | Do et al. | 257/706 |
| 7,227,086 | B2 | 6/2007 | Lee et al. | 174/521 |
| 7,285,864 | B2 | 10/2007 | Takyu et al. | 257/777 |
| 7,323,786 | B2 | 1/2008 | Sasaki | 257/777 |
| 2001/0023994 | A1 | 9/2001 | Oka | |
| 2002/0014689 | A1 | 2/2002 | Lo et al. | |
| 2002/0030262 | A1 | 3/2002 | Akram | 257/686 |
| 2002/0030263 | A1 | 3/2002 | Akram | |
| 2002/0064905 | A1 | 5/2002 | Park et al. | |
| 2002/0096755 | A1 | 7/2002 | Fukui et al. | |
| 2002/0109216 | A1 | 8/2002 | Matsuzaki et al. | 257/686 |
| 2002/0125556 | A1 | 9/2002 | Oh et al. | 257/685 |
| 2002/0130398 | A1* | 9/2002 | Huang | 257/666 |
| 2002/0171136 | A1 | 11/2002 | Hiraoka et al. | |
| 2002/0195624 | A1 | 12/2002 | Glenn et al. | 257/200 |
| 2003/0001252 | A1 | 1/2003 | Ku et al. | |
| 2003/0038355 | A1 | 2/2003 | Derderian | |
| 2003/0038356 | A1 | 2/2003 | Derderian | |
| 2003/0038357 | A1 | 2/2003 | Derderian | 257/686 |
| 2003/0047754 | A1* | 3/2003 | Hsu et al. | 257/200 |
| 2003/0127719 | A1 | 7/2003 | Chang | 257/685 |
| 2003/0137042 | A1 | 7/2003 | Mess et al. | |
| 2003/0137595 | A1 | 7/2003 | Takachi | 348/340 |
| 2003/0178710 | A1 | 9/2003 | Kang et al. | 257/673 |
| 2003/0189259 | A1 | 10/2003 | Kurita et al. | |

| | | | |
|---|---|---|---|
| 2003/0199118 A1 | 10/2003 | Park et al. | |
| 2004/0041249 A1 | 3/2004 | Tsai et al. | |
| 2004/0051168 A1* | 3/2004 | Arai et al. | 257/678 |
| 2004/0119152 A1* | 6/2004 | Karnezos et al. | 257/686 |
| 2004/0126926 A1 | 7/2004 | Arai et al. | |
| 2004/0169285 A1 | 9/2004 | Verma et al. | |
| 2004/0200885 A1 | 10/2004 | Derderian | |
| 2004/0241907 A1 | 12/2004 | Higashino et al. | |
| 2005/0012196 A1 | 1/2005 | Akram | 257/686 |
| 2005/0104183 A1 | 5/2005 | Kuroda et al. | 257/686 |
| 2005/0133916 A1 | 6/2005 | Karnezos | 257/738 |
| 2005/0179127 A1* | 8/2005 | Takyu et al. | 257/724 |
| 2006/0097374 A1 | 5/2006 | Egawa | 257/686 |

FOREIGN PATENT DOCUMENTS

| | | |
|---|---|---|
| GB | 1 0220329 | 7/1964 |
| GB | 2 146 504 | 4/1985 |
| JP | 56-062351 | 5/1981 |
| JP | 59-228755 | 12/1984 |
| JP | 60-182731 | 9/1985 |
| JP | 61-117858 | 6/1986 |
| JP | 62-008534 | 1/1987 |
| JP | 62-126661 | 6/1987 |
| JP | 62-224047 | 10/1987 |
| JP | 63-128736 | 6/1988 |
| JP | 63-244654 | 10/1988 |
| JP | 64-001269 | 1/1989 |
| JP | 64-028856 | 1/1989 |
| JP | 64-071162 | 3/1989 |
| JP | 01-099248 | 4/1989 |
| JP | 03-165550 | 7/1991 |
| JP | 03-169062 | 7/1991 |
| JP | 04-028260 | 1/1992 |
| JP | 04-056262 | 2/1992 |
| JP | 04-096358 | 3/1992 |
| JP | 04-116859 | 4/1992 |
| JP | 05-013665 | 1/1993 |
| JP | 05-075015 | 3/1993 |
| JP | 05-109975 | 4/1993 |
| JP | 05-136323 | 6/1993 |
| JP | 08-288455 | 11/1996 |
| JP | 09-021938 | 1/1997 |
| JP | 09-232548 | 9/1997 |
| JP | 10-027880 | 1/1998 |
| JP | 10-256470 | 9/1998 |
| JP | 10-302587 | 11/1998 |
| JP | 2001-308262 | 11/2001 |
| JP | 2002-093992 | 3/2002 |
| JP | 2002-222913 | 8/2002 |
| JP | 2004-072009 | 3/2004 |
| JP | 2004-193363 | 7/2004 |
| KR | 2001-0001596 | 1/2001 |
| KR | 2002-0015214 | 2/2002 |
| KR | 2002-0062857 | 7/2002 |
| KR | 2002-0072145 | 9/2002 |
| KR | 2003-0075860 | 9/2003 |
| TW | 544 902 | 8/2003 |
| WO | WO 93/22787 | 11/1993 |
| WO | WO 00/038103 | 6/2000 |
| WO | WO 03/019660 | 3/2003 |

OTHER PUBLICATIONS

St. Amand et al., U.S. Appl. No. 11/356,919, entitled "Stacked electronic component package having single-sided film spacer", filed Feb. 17, 2006.

Oh et al., "A Stacked Semiconductor Package Having an Insulator to Prevent Shorting of Wirebonds", U.S. Appl. No. 10/015,374, filed Dec. 12, 2001.

Oh et al., "Method of Forming a Stacked Semiconductor Package", U.S. Appl. No. 11/286,970, filed Nov. 22, 2005.

Oh et al., "Adhesive on Wire Stacked Semiconductor Package", U.S. Appl. No. 12/317,649. filed Dec. 23, 2008.

* cited by examiner

SEMICONDUCTOR PACKAGE

BACKGROUND OF THE INVENTION

1. Field of the Invention

The present invention relates to semiconductor package and method of making the same.

2. Description of the Related Art

In recent semiconductor packages, a lead frame is replaced by a printed circuit board, so as to lower the inductance and greatly improve electric capability, heat discharging capability and surface mounting capability of the semiconductor package.

In such a semiconductor package, a semiconductor die is mounted on a printed circuit board by using an adhesive, die pads are in turn wire-bonded to bond fingers of the printed circuit board by conductive wires, and then the semiconductor die is encapsulated by using an Epoxy Molding Compound (EMC).

On the other hand, as the weight and size of small sized and portable electric/electronic devices, such as cellular phone, digital video camcorders, digital cameras, lap-top computers, etc., gradually reduces more and more, it is necessary to also reduce the weight and size of semiconductor packages mounted in the electric/electronic devices. This requirement has caused appearance of ultra-small sized semiconductor packages such as chip size package and wafer level chip size package.

The encapsulation of the semiconductor die is performed by a transfer molding in which melted EMC is injected into a mold. In the semiconductor package, it is typical to secure a distance of at least 10 mil between a surface of the semiconductor die and a surface of molded semiconductor package in order to avoid occurrence of voids in the semiconductor package as well as to prevent incomplete molding of the semiconductor package. However, such a transfer molding using the EMC may cause big limit in realization of ultra-small or ultra-slim semiconductor packages, which is a recently popular trend.

Further, in the transfer molding using the EMC, the EMC is injected into the semiconductor package from one side of the semiconductor die, which may cause a wire sweeping phenomenon in which conductive wires are gathered on one side of the semiconductor package.

Moreover, the wire sweeping may separate the bonded conductive wires from the bond pads of the semiconductor die or the bond fingers of the printed circuit board, thereby causing disconnection of the conductive wires and electrical interconnection of the conductive wires, which may induce the electrical short-circuit.

Furthermore, according to the transfer molding manner using EMC, the completed semiconductor package only comes in a black color. Therefore, the semiconductor package fails to satisfy a consumer expectation of various colored semiconductor packages, thereby reducing a consumer's purchasing desire.

SUMMARY OF THE INVENTION

In accordance with one embodiment, in a semiconductor package, a substrate and a semiconductor die are covered with and encapsulated by vertically pressing thermosetting resin having fluidity in a predetermined temperature range and denaturalizing itself in gel. In another semiconductor package, an upper portion of a semiconductor die and a part of conductive wires are covered and encapsulated with thermosetting resin in order to form an empty space at the sides of the semiconductor package. In still another semiconductor package, supporting portions having various colors, e.g., other than black, may be attached to the semiconductor package. In still another semiconductor package, at least one semiconductor die may be vertically stacked. In the method of making a semiconductor package, after a semiconductor die is bonded and connected to an upper surface of a substrate in a wire bonding manner, encapsulant is vertically pressed over the semiconductor die, thereby achieving the semiconductor package. Thus, it is possible to reduce a thickness of the semiconductor package and prevent wire sweeping.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION

Figure 1:
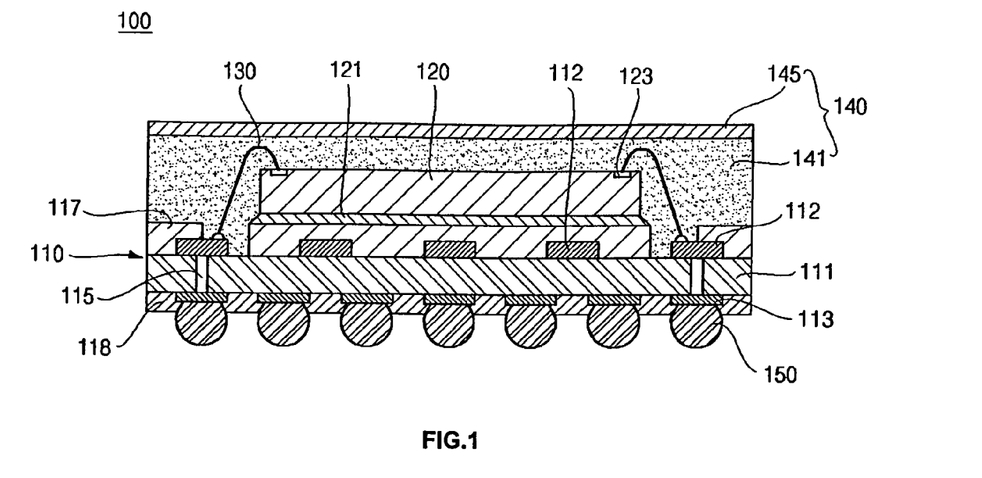
FIG. 1 is a sectional view showing a semiconductor package according to an embodiment of the present invention.

Referring to FIG. 1, there is shown a sectional view of a semiconductor package according to an embodiment of the present invention.

As shown in FIG. 1, the semiconductor package 100 according to the embodiment of the present invention includes a substrate 110 substantially having a plate shape, a semiconductor die 120 adhered to an upper surface of the substrate 110, a plurality of conductive wires 130 electrically connecting the semiconductor die 120 to the substrate 110, an encapsulant 140 covering the semiconductor die 120 and the conductive wires 130 which are located on the upper surface of the substrate 110, for protecting the semiconductor die 120 and the conductive wires 130 from exterior environment, and a plurality of solder balls 150 welded to a lower surface of the substrate 110 and used for mounting the semiconductor package to an exterior device. Here, if the above-mentioned structure is defined to a unit, a plurality of units is arranged in a line or in a row, or in lines or in rows in a gang process. Generally, the semiconductor package is completed through the gang process, and then is singulated into the individual semiconductor package. Hereinafter, a semiconductor package and a method of making the same with respect to a unit of the semiconductor package will be described. Further, it will be illustrated an example of the semiconductor package in which a printed circuit board is used as the substrate 110, but it will be noted that the substrate is not limited to only the printed circuit board and that a tape substrate and a lead frame may be used as a substrate. Therefore, the substrate 110 is not limited to these members. Further, the semiconductor package will be described as an example in which the semiconductor die 120 is electrically connected to the substrate 110 in a wire bonding manner, but it is understood that it is possible to use various bonding manners including a stud bump bonding manner and a flip chip manner. Therefore, the bonding manner is not limited.

The substrate 110 includes a thermosetting resin layer 111 which is a substantially flat plate, a plurality of upper conductive patterns 112 formed on an upper surface of the resin layer 111, a plurality of lower conductive patterns 113 formed on a lower surface of the resin layer 111, a plurality of conductive vias 115 electrically connecting the upper conductive patterns 112 to the lower conductive patterns 113, an upper solder mask 117 covering a portion of the upper surface of the resin layer 111 and the upper conductive patterns 112, and a lower solder mask 118 covering a portion of the upper surface of the resin layer 111 and the lower conductive patterns 113.

Here, the upper and lower conductive patterns 112 and 113 are suitably made of copper material, but the material of the upper and lower conductive patterns is not limited to the copper. Portions of the upper conductive patterns 112 which are connected to the conductive wires 130 are referred to as bond fingers, while portions of the lower conductive patterns 113 which are connected to the solder balls 150 are referred to as ball lands. Further, plated layers are formed of nickel and aurum (gold) on the bond fingers and the ball lands, respectively. This is to rigidly connect or fusion-weld the conductive wires 130 and the solder balls 150 to the bond fingers and the ball lands, respectively. Of course, in order to perform the connection and fusion-welding with respect to the ball lands and the bond fingers, the ball lands and the bond fingers need not be covered with the solder masks 117 and 118. Suitably, the upper and lower conductive patterns 112 and 113 are formed in a photolithographic manner, but the process of forming the upper and lower conductive patterns 112 and 113 is not limited.

On the other hand, the conductive vias 115 are formed in a form of hole which penetrates the upper and lower surfaces of the resin layer 111 in order to electrically connect the upper conductive pattern 112 and the lower conductive pattern 113 to each other. The conductive vias 115 respectively have an inner surface coated with copper. The plurality of conductive vias 115 may be formed, but the number of the conductive vias 115 is not limited to two vias formed at both sides of the substrate 110 as shown in FIG. 2.

In the upper solder mask 117, a portion of the upper solder mask 117 covering the bond fingers has a height substantially identical to that of another portion which covers the conductive pattern. Likewise, in the lower solder mask 118, the portion covering the lower conductive pattern 113 has a thickness substantially identical to that. The upper and lower solder masks 117 and 118 may be formed of epoxy resin, acryl resin or equivalent material thereof. However, the material and forming method of the solder masks 117 and 118 are not limited.

Meanwhile, the semiconductor die 120 is adhered by an adhesive 121 to a center portion of the upper surface of the substrate 110. The adhesive 121 may generally be epoxy resin, adhesive tape, adhesive film, or the equivalent material thereof, but is not limited to these materials. As shown in FIG. 1, the adhesive layer 121 has a sectional shape which is gradually narrower toward an upper portion thereof, but the sectional shape of the adhesive layer 121 is not limited. The semiconductor die 120 is adhered to the surface of the upper solder mask 117 which is substantially horizontal surface because the upper solder mask 117 has an even thickness or flatness throughout the entire region thereof regardless of the existence of the upper conductive pattern 112. Since the adhesive 121 attaches the lower surface of the semiconductor die 120 to the upper surface of the upper solder mask 117 having a high flatness, the semiconductor die 120 can be rigidly adhered to the upper solder mask 117.

However, the flatness of the upper surface of the upper solder mask 117 is not limited. The semiconductor die 120 is a substantially rectangular hexahedron with upper and lower flat surfaces. However, the shape of the semiconductor die 120 is not limited. Die pads 123 are formed on a portion of the upper surface of the semiconductor die 120 in order to electrically connect the semiconductor die 120 to the outside. The die pads 123 are formed such that an upper surface thereof is located at a level identical with, or at a level lower than, the upper surface of the semiconductor die 120.

Next, the conductive wires 130 electrically connect the semiconductor die 120 to the substrate 110. More particularly, the conductive wires 130 electrically connect the die pads 123 of the semiconductor die 120 to the bond fingers of the substrate 110. At this time, the conductive wires 130 are bonded to the die pads 123 in a stitch bonding manner and attached to the bond fingers in a ball bonding manner, respectively. More particularly, when the conductive wires 130 are bonded to the bond fingers and the die pads 123, one end of a conductive wire 130 is formed with a ball having a predetermined size by electric discharge, which is then fusion-welded to a surface of the bond finger, while the other end of the conductive wire 130 is extended and bonded to the die pad 123 without formation of a ball by stitch-boding using through application of ultrasonic waves and heat. Therefore, an angle between the conductive wire 130 and the surface of the bond finger is larger than an angle between the conductive wire 130 and the die pad 123. Since the conductive wires 130 are rubbed on and attached to the die pad 123 without balls, the conductive wires 130 must reach the surface of the die pad 123. As a result, it is possible to lower the height of the conductive wire 130 entirely, thereby also decreasing the height of the encapsulant 140. The conductive wire 130 may be a gold wire, an aluminum wire, and the equivalent materials thereof, but is not limited to these materials.

Meanwhile, the encapsulant 140 includes an adhering portion 141 made of thermosetting resin having fluidity in a predetermined temperature range, and a supporting portion 145 attached to an upper surface of the adhering portion 141 so as to support the adhering portion 141. The encapsulant 140 encloses the semiconductor die 120 and the conductive wires 130 on the substrate 110, thereby protecting them from the exterior environment. The encapsulant 140 is formed of material having fluidity in a pressing manner, instead of transfer molding manner using the epoxy molding compound. Thus, the encapsulant 140 causes the semiconductor package 100 to have a reduced height, while preventing the conductive wires 130 from being cut or subjected to electric short due to the wire sweeping.

The adhering portion 141 is formed of thermosetting resin having fluidity in a predetermined temperature range and then is cured when the adhering portion is heated. The adhering portion 141 is denaturalized in a gel state at a temperature of 50° C. to 200° C. and cured in a range of the temperature of 50° C. to 200° C., for example over a temperature of about 160° C. However, it is understood that the temperature of the adhering portion 141 in the gel state and the curing temperature of the adhering portion 141 are examples, but are not limited to the above-mentioned temperature ranges. Further, the adhering portion 141 has a thickness of about 2 mil to 3 mil after the adhering portion 141 is pressed, but the thickness of the adhering portion 141 is not limited. The adhering portion 141 covers the entire upper surface of the substrate 110, the semiconductor die 120, and the conductive wires 130. The adhering portion 141 is heated to the temperature of 50° C. to 200° C. and denaturalized in the gel having the fluidity, which is in turn pressed downward to cover the upper surface of the substrate 110, the semiconductor die 120, and the conductive wires 130. Finally, the adhering portion 141 is heated for a half hour to six hours, resulting in the cured adhering portion 141.

The supporting portion 145 is formed to cover an upper surface of the adhering portion 141. The supporting portion 145 is made of insulation substance such as polyimide and epoxy, or the equivalent materials thereof, but the material of the supporting portion 145 is not limited to these materials. Further, the supporting portion 145 has enough hardness to maintain flatness entirely. At this time, the supporting portion 145 is adhered to the upper surface of the adhering portion by an adhesive. That is, the supporting portion 145 is adhered in advance to the adhering portion 141 by heat and/or pressure. Therefore, the supporting portion 145 and the adhering portion 141 are adhered to each other before the encapsulant 140 is pressed. Suitably, the supporting portion 145 has a substantially identical area with that of the surface of the adhering portion 141. However, the area of the supporting portion 145 is not limited. The supporting portion 145 may be formed with a thickness of about 0.5 mil to 1 mil, but the thickness of the supporting portion 145 is not limited. The supporting portion 145 is made of material having the high heat conductivity so as to smoothly discharge heat. Furthermore, since the supporting portion 145 may be dyed with various colors it is possible to make the semiconductor packages having various colors, e.g., other than black, according to consumer's favorite, thereby increasing consumer's desire for purchasing the semiconductor packages.

The encapsulant 140 is formed with a thickness of 2.5 mil to 4 mil on the upper surface of the semiconductor die 120 in spite of attaching the supporting portion 145 to the adhering portion 141. In contrast, when the encapsulant is formed in the conventional transfer molding manner, the encapsulant generally has a thickness of about 10 mil from the upper surface of the semiconductor die to the upper surface of the semiconductor package. However, the encapsulant 140 according to the present invention has the thickness reduced by up to about 6 mil to 7 mil, as compared with the above-mentioned encapsulant formed using the transfer molding method, so that the encapsulant 140 is advantageous for making the extremely thin semiconductor package.

Further, the solder balls 150 are fusion-welded to the ball lands exposed downward through the lower solder mask 118 which is formed on the lower surface of the substrate 110. The solder balls 150 are fusion-welded to the ball lands in such a manner that the substrate passes through a furnace after flux is injected into solder and then an amount of solder necessary for forming each solder ball is dropped on each ball land. While the substrate passes through the furnace, the flux is volatilized and only the solder balls 150 are fusion-welded to the lower conductive pattern 113. These solder balls 150 are surface-mounted on the exterior device by using a reflow process, so as to enable the semiconductor package 100 to transmit and receive electric signals to/from the exterior device.

Referring to FIGS. 2A through 2F, there are shown sectional views illustrating the method of making the semiconductor package according to an embodiment of the present invention.

As shown in FIG. 2A to 2F, the method of making the semiconductor package 100 includes an operation of forming the substrate 110, an operation of forming solder masks 117 and 118 on the upper and lower surfaces of the substrate 110, an operation of attaching the semiconductor die 120 to the substrate 110 by an adhesive 121, an operation of bonding wires 130 to the die pads 123 of the semiconductor die 120 and the bond fingers of the substrate 110 in order to electrically connect the semiconductor die 120 to the substrate 110, an operation of pressing the encapsulant 140, and an operation of fusion-welding the solder balls 150 to the ball land of the lower surface of the substrate 110. Further, the operation of pressing the encapsulant 140 includes an operation of attaching the supporting portion 145 to the adhering portion 141, and a first heat operation of heating the adhering portion 141 having fluidity. Furthermore, in the operation of pressing the encapsulant 140, it may be performed a second heating operation of heating the adhering portion 140 up to a predetermined temperature in order to cure the adhering portion 140 after the first heating operation.

Referring to FIG. 2A again, there is shown a sectional view illustrating the operation of making the substrate 110. As shown in FIG. 2, a thermosetting resin layer 111 having a substantially plate shape has a plurality of upper conductive patterns 112 formed on an upper surface thereof, and a plurality of lower conductive patterns 113 formed on a lower surface thereof. Suitably, the conductive patterns 112 and 113 are formed of copper having the high conductivity using a photolithography method. However, the material or forming method of the conductive patterns 112 and 113 are not limited. After the conductive patterns 112 and 113 are formed, a plurality of conductive vias 115 are formed in order to electrically connect the upper and lower conductive patterns 112 and 113 to each other.

Figure 2A:
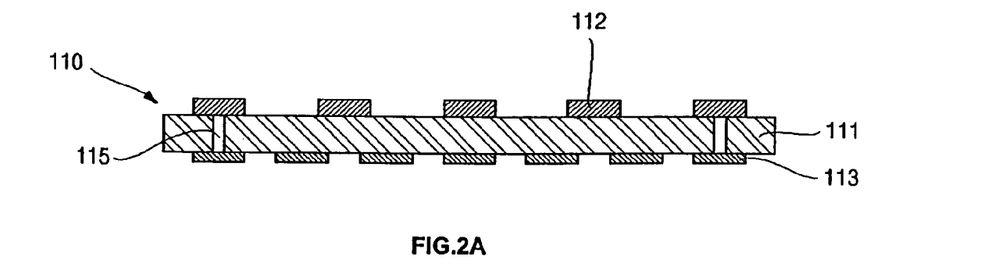
FIGS. 2A through 2F are sectional views illustrating a method of making the semiconductor package according to the embodiment of the present invention shown in FIG. 1.
Figure 2B:
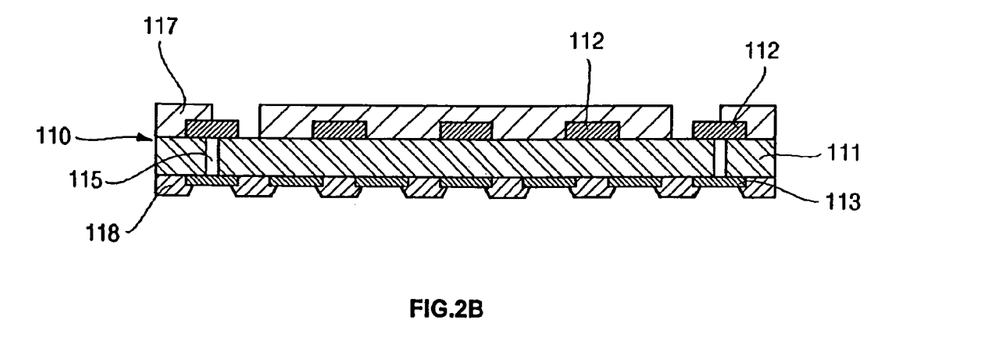

Referring to FIG. 2B again, there is shown a sectional view illustrating the operation of forming solder mask 117 and 118. As shown in FIG. 2B, the solder masks 117 and 118 are formed on the conductive patterns 112 and 113 of the substrate 110 in such a manner that regions corresponding to bond fingers and ball lands of the conductive patterns 112 and 113 are exposed. More particularly, the upper solder mask 117 is formed on the upper conductive pattern 112, while the lower solder mask 118 is formed on the lower conductive pattern 118. The upper solder mask 117 may cover the bond fingers in such a manner that a portion of the bold finger to which the conductive wire 130 is bonded is exposed to exterior, or in such a manner that the entire upper conductive patterns 112 corresponding to the bold fingers are exposed. Furthermore, the upper solder mask 117 is formed to have even thickness throughout the substrate 110. The operation of forming the solder masks 117 and 118 is carried out in order to coat and protect the conductive patterns, except for a portion of the conductive patterns that must be electrically connected to the exterior through the conductive wires 130 or the solder balls 150, with insulation material. In this operation, the solder masks 117 and 118 may be formed of epoxy, acryl, or the equivalent materials by using the photolithographic method. However, the material or forming method of the solder masks 117 and 118 is not limited.

Figure 2C:
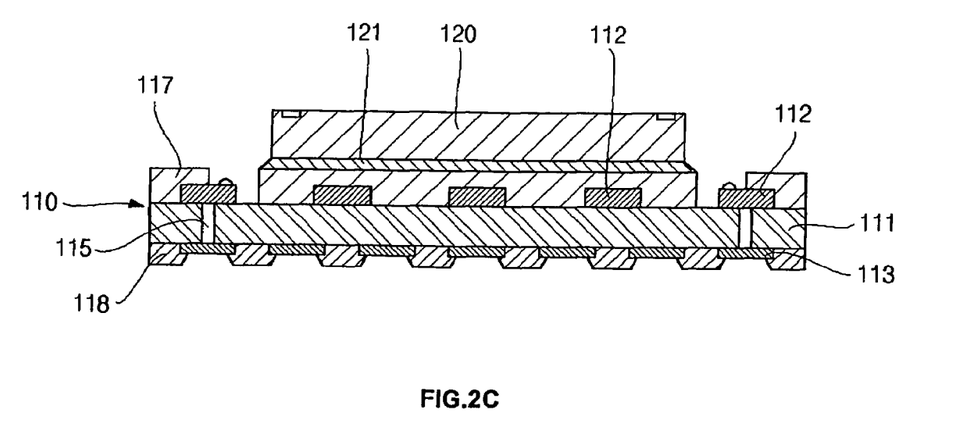

Referring to FIG. 2C next, there is shown a sectional view illustrating the operation of attaching the semiconductor die 120 to the substrate 110. As shown in FIG. 2C, the semiconductor die 120 is attached to a center portion of the upper surface of the substrate 110.

Figure 2D:
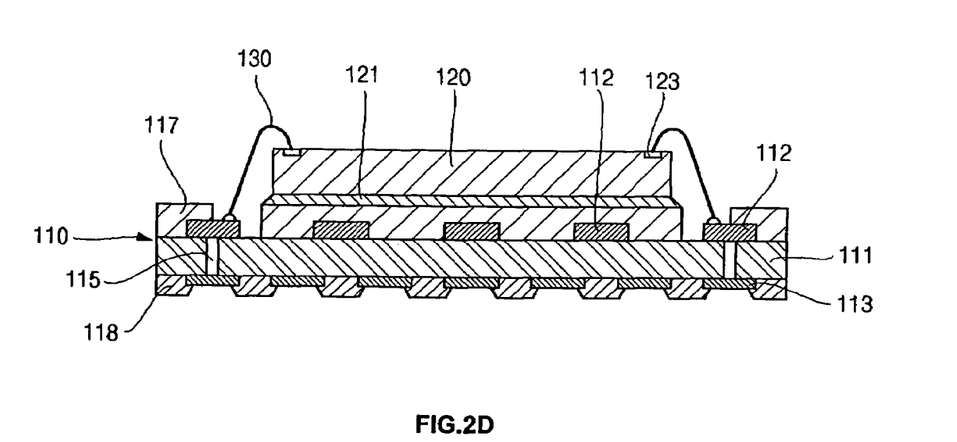

Referring to FIG. 2D next, there is shown a sectional view illustrating the operation of bonding wires. As shown in FIG. 2D, the die pads 123 of the semiconductor die 120 are electrically connected to the bond fingers of the substrate 110 by the conductive wires 130. First, the conductive wires extend at a predetermined distance from a capillary (not shown) and then have ball formed at one end of the conductive wires by an electric discharge to have a predetermined size. Next, the balls of the conductive wires are in close contact with the bond fingers of the substrate 110 respectively. At the same time, energy such as ultrasonic vibration is applied from the capillary to the balls of the conductive wires 130 and heat also is applied from the exterior to the ball of the conductive wires, thereby bonding the conductive wires to the substrate 110. Then, a looping process is performed in which a tip of the capillary is rubbed on a surface of the bond pads when the capillary reaches the bond pads of the semiconductor die 120 while the ultrasonic vibration and heat are applied to the capillary tip, thereby achieving the stitch bonding. Then, a clamp (not shown) is closed and a cutting of the conductive wires 130 is carried out.

Though not shown, the operation of pressing the encapsulant 140 is performed after the operation of attaching the supporting portion 145 to the adhering portion 141 and the first heating operation of heating the adhering portion 141 in the flowing state. The operation of attaching the supporting portion 145 is a process in which the adhering portion 141 is formed to have the substantially flat plat shape and then the supporting portion 145 is attached to the upper surface of the adhering portion 141 by the adhesive. The first heating operation is a process in which the adhering portion 141 is heated and then is denaturalized in the gel having the fluidity. The first heating operation is carried out at a temperature of 50° C. to 200° C., so that the adhering portion 141 is substantially changed into a liquid state having enough fluidity. Therefore, the encapsulant 140 including the adhering portion 141 is vertically pressed in the gel state on the substrate 110, the semiconductor die 120 and the conductive wires 130, thereby having no effect on the conductive wires 130 and preventing the wire sweeping phenomenon.

Figure 2E:
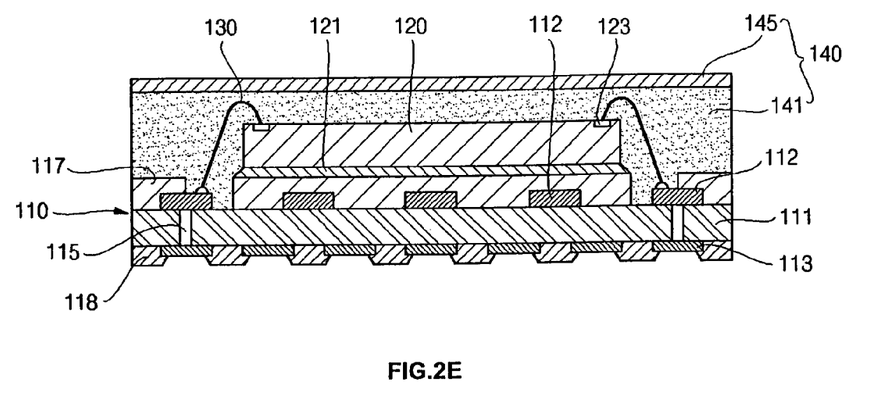

Referring to FIG. 2E next, there is shown a sectional view illustrating the operation of pressing the encapsulant 140.

As shown in FIG. 2E, the encapsulant 140 is pressed downward from the upper portion of the semiconductor die 120, so as to cover the entire upper surface of the substrate 110. At this time, the adhering portion 141 is formed to cover the substrate 110, the semiconductor die 120 and the conductive wires 130, but it is necessary to adjust the thickness of the adhering portion 141 before the adhering portion 141 is pressed, in order to form the adhering portion 141 having a minimized thickness.

Though not shown, the second heating operation is performed in which the pressed adhering portion 141 is heated to a predetermined temperature so as to cure the adhering portion 141, after the operation of pressing the encapsulant 140. The second heating operation is carried out at a temperature of 50° C. to 200° C. for a half hour to six hours, so that the adhering portion in the gel state is cured into a rigid solid state.

Figure 2F:
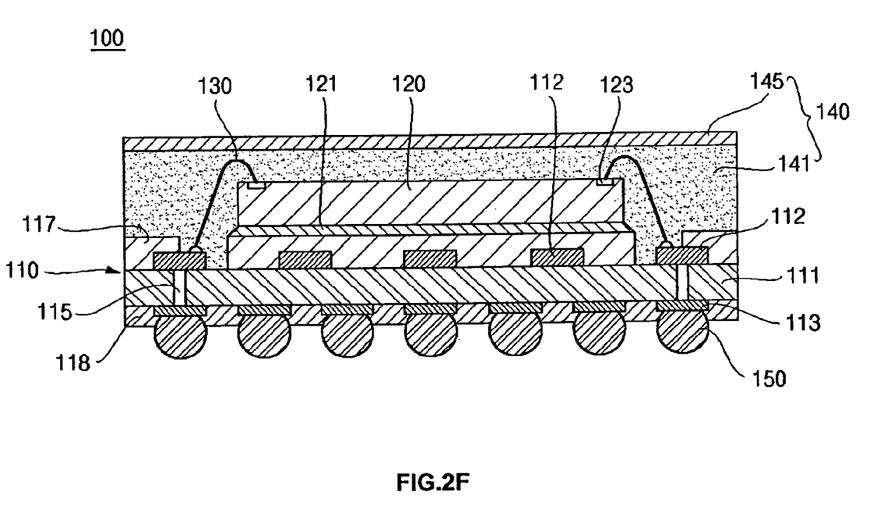

Referring next to FIG. 2F, there is shown a sectional view illustrating the operation of fusion-welding the solder balls.

As shown in FIG. 2F, the ball lands of the lower conductive patterns 113 to be a portion at which the solder balls 150 are formed is not covered with the lower solder mask 118 and exposed to the exterior. First, flux is injected into the ball lands and then an amount of solder material, enough to form the solder balls, is dropped on the flux. Then, the fusion-welding of the solder balls is performed in a furnace. The flux is volatilized and discharged out of the furnace. As a result, the solder balls 150 are fusion-welded and electrically connected to the lower conductive pattern 113.

As described above, the semiconductor package 100 according to the present invention has the encapsulant 140 remarkably reduced in thickness, as compared with the semiconductor package made in the transfer molding manner. As a result, the semiconductor package becomes thin and can be widely applied to electric/electron devices requiring extremely small-sized and extremely thin semiconductor package. Further, in the semiconductor package 100 according to the present invention, the encapsulant 140 in gel is vertically pressed downward so as not to apply force to the conductive wires 130, thereby preventing open circuit or short circuit from being caused due to the wire sweeping phenomenon.

Figure 3:
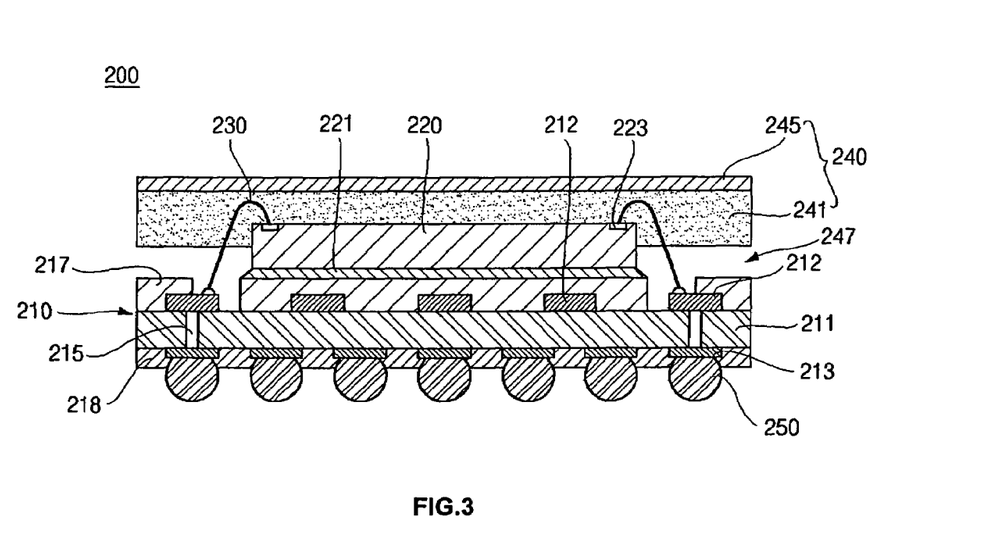
FIG. 3 is a sectional view showing a semiconductor package according to another embodiment of the present invention.

Referring to FIG. 3, there is shown a sectional view of the semiconductor package according to another embodiment of the present invention. As shown in FIG. 3, the semiconductor package 200 according to another embodiment of the present invention has a structure similar to the semiconductor package 100 according to the embodiment of FIG. 1. The description of the same element as that of the semiconductor package 100 will be omitted. Further, the method of making the semiconductor package 100 according to the embodiment shown in FIG. 3 is identical with the method of making the semiconductor package 100 according to the embodiment shown in FIG. 1. Therefore, the description of the method of making the semiconductor package will be omitted.

As shown in FIG. 3, the semiconductor package 200 according to another embodiment of the present invention includes a substrate 210 having a substantially flat plate shape, a semiconductor die 220 adhered to an upper surface of the substrate 210, a plurality of conductive wires 230 electrically connecting the semiconductor die 220 to the substrate 210, an encapsulant 240 covering the semiconductor die 220 and the conductive wires 230 disposed on the upper surface of the substrate 210, so as to protect them from exterior environment, and a plurality of solder balls 250 fusion-welded to a lower surface of the substrate 210 and mounted on an exterior device.

First, the substrate 210 has a plurality of conductive patterns 212 and 213 which are formed upper and lower surfaces of a plate shaped thermosetting resin layer 211, respectively. The substrate 210 also has conductive vias 215 to electrically connect the upper conductive patterns 212 formed on the upper surface of the substrate 210 to the lower conductive patterns 213 formed on the lower surface of the substrate 210. Further, the substrate 210 includes an upper solder mask 217 covering a portion of an upper surface of the upper conductive patterns 212 and the resin layer 211, and a lower solder mask 218 covering a portion of a lower surface of the lower conductive patterns 213 and the resin layer 211.

Meanwhile, the semiconductor die 220 is attached to a center portion of the upper surface of the substrate 210 by an adhesive 221, and has die pads 223 formed on the upper surface thereof to which the conductive wires 230 are bonded.

The conductive wires 230 electrically connect the die pads 223 of semiconductor die 220 to bond fingers of the substrate 210. At this time, the conductive wires 230 are first bonded to the bond fingers in a ball bonding manner, which in turn is bonded to the die pads 223 in a stitch bonding manner, as described above relating to the afore-mentioned previous embodiment.

The encapsulant 240 includes an adhering portion 241 and a supporting portion 245. The adhering portion 241 is formed of thermosetting resin having fluidity at a predetermined temperature range, while the supporting portion 245 is formed of polyimide, epoxy, or the equivalent materials thereof. At this time, the encapsulant 240 is formed to cover the semiconductor die 220 and the conductive wires 230 so that a part of the upper surface of the substrate 210 is exposed to the exterior. In other words, the encapsulant 240 is downward pressed over the upper surface of the semiconductor die 220 and the conductive wires 230, in order to enclose the upper surface of the semiconductor die 220 and an upper portion of the conductive wires 230. Therefore, a portion of the semiconductor package 200 is not enclosed by the encapsulant 240 to have empty space portion 247. The space portion 247 may be filled with epoxy molding compound by a separate encapsulation process or remain empty, after the semiconductor package 200 is mounted on a printed circuit board. In a case where the space portion 247 is filled with the epoxy molding compound, the space portion 247 is filled with the epoxy molding compound in the transfer molding manner. At this time, since the adhering portion 241 secures the upper portion of the conductive wires 230, there is no danger that the wire sweeping occurs although the epoxy molding compound is filled in the space portion. In order to form the encapsulant 240 so that the encapsulant 240 covers a portion of the semiconductor package 200, an amount of the adhering portion 241 must be adjusted before the adhering portion 241 is pressed. At this time, the amount of the adhering portion 241 is smaller than that of adhering portion 141 shown in FIG. 1, thereby obtaining the same structure as that of this embodiment of the present invention. That is, the amount of the adhering portion 241 is adjusted so that a size of the region in which the encapsulant 240 is formed can be adjusted.

On the other hand, the solder balls 250 are fusion-welded to the ball lands downwardly exposed through the lower solder mask 218, respectively. The solder balls 250 play the role of electrically connecting a wiring pattern and the semiconductor package 200 to each other.

Therefore, The semiconductor package 200 is coupled to a printed circuit board by a coupling force of the solder balls 250. Moreover, in the semiconductor package 200 according to another embodiment of the present invention, the epoxy molding compound filled in the space portion 247 plays the role of securing the semiconductor package 200. Further, it is possible to reduce the amount of the adhering portion 241 used for the semiconductor package 200, thereby reducing the manufacturing cost of the semiconductor package 200.

Figure 4:
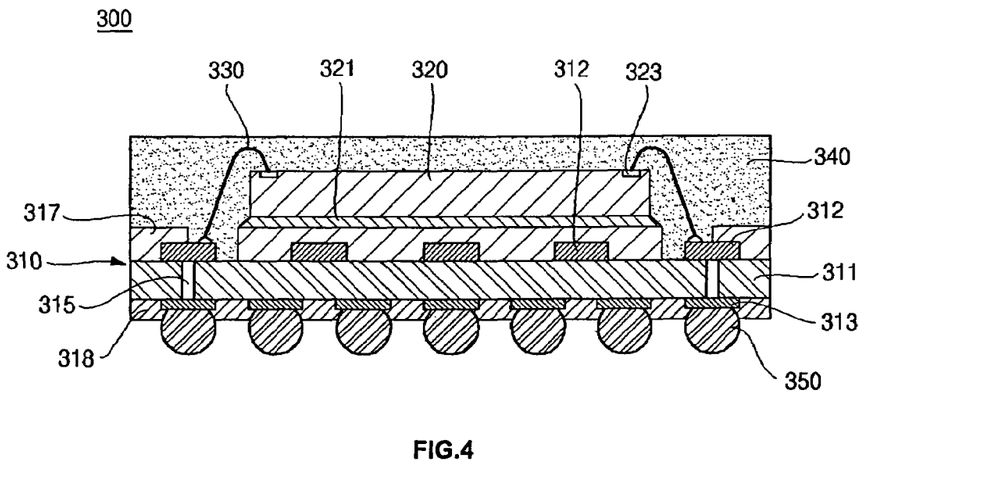
FIG. 4 is a sectional view showing a semiconductor package according to still another embodiment of the present invention.

Referring to FIG. 4, there is shown a sectional view of a semiconductor package according to still another embodiment of the present invention. As shown in FIG. 4, the semiconductor package 300 according to still another embodiment of the present invention has a structure similar to the semiconductor package 100 according to the embodiment shown in FIG. 1, the description of the same elements as those of the semiconductor package 100 will be omitted. Further, since the method of making the semiconductor package 300 according to the embodiment shown in FIG. 4 is similar to the method of making the semiconductor package 100, no views illustrating the method of making the semiconductor package 300 are shown, and only difference from the previous embodiments will be described.

As shown in FIG. 4, the semiconductor package 300 according to still another embodiment of the present invention includes a plate shaped substrate 310, a semiconductor die 320 adhered to an upper surface of the substrate 310, a plurality of conductive wires 330 for electrically connecting the semiconductor die 320 to the substrate 310, an encapsulant 340 for covering and protecting the semiconductor die 320 and the conductive wires 330 disposed on the upper surface of the substrate 310 from the exterior environment, and a plurality of solder balls 350 fusion-welded to a lower surface of the substrate 310 and mounted on an exterior device.

First, the substrate 310 has a plurality of conductive patterns 312 and 313 formed on upper and lower surfaces of the plate shaped thermosetting resin layer 311, and conductive vias 315 formed therein so as to electrically connect the upper conductive patterns 312 to the lower conductive patterns 313. Further, the substrate 310 includes an upper solder mask 317 covering a portion of an upper surface of the resin layer 311 and the upper conductive patterns 312, and a lower solder mask 318 covering a portion of a lower surface of the resin layer 311 and the lower conductive patterns 313.

Next, the semiconductor die 320 is attached to a center portion of the upper surface of the substrate 310 by an adhesive 321, and has die pads 323 formed thereon to which the conductive wires 330 is bonded.

The conductive wires 330 electrically connect the die pads 323 of the semiconductor die 320 to bond fingers of the substrate 310. At this time, the conductive wires 330 is first bonded to the bond fingers in a ball bonding manner, which in turn is bonded to the die pads in a stitch bonding manner.

Here, the encapsulant 340 only has an adhering portion, which can be colored. The encapsulant 340 is made of thermosetting resin having fluidity in a predetermined temperature range. A supporting portion is attached to an upper surface of the adhering portion until the encapsulant 340 is pressed and then cured. When the encapsulant 340 is cured, the supporting portion is separated from the upper surface of the adhering portion and only the adhering portion remains. The supporting portion is attached to the adhering portion in order to maintain a shape of the adhering portion having sufficient fluidity and to easily perform the pressing operation. Therefore, even if the supporting portion is removed from the adhering portion after the pressing operation, there is no problem. However, when the supporting portion is separated from the adhering portion right after the pressing operation, it has an effect on the conductive wires 330, etc. Therefore, it is suitable to remove the supporting portion from the adhering portion after completely curing the adhering portion.

Further, the encapsulant 340 may be formed to cover only the semiconductor die 320 and the conductive wires 330 so that a portion of the upper surface of the substrate 310 is exposed to the exterior, like the embodiment shown in FIG. 3. That is, the encapsulant 340 may be formed such that empty space exists in the encapsulant 340, though not shown in FIG. 4.

Meanwhile, the solder balls 350 are fusion-welded to the ball lands downward exposed through the lower solder mask 318 which is formed on the lower surface. The solder balls 350 plays the role of electrically connecting a wire pattern of a printed circuit board to the semiconductor package 300 when the semiconductor package 300 is mounted on a surface of the printed circuit board.

As described above, in the semiconductor package 300 according to still another embodiment of the present invention, the supporting portion is removed from the semiconductor package 300, thereby reducing the thickness of the semiconductor package 300.

Hereinafter, the method of making the semiconductor package 300 according to still another embodiment of the present invention will be described.

The method of making the semiconductor package 300 according to still another embodiment of the present invention includes the operation of removing the supporting portion in addition to the operations described above relating to FIGS. 2A to 2F. That is, the method of making the semiconductor package 300 according to the embodiment shown in FIG. 4 includes the operation of making the substrate 310, the operation of attaching the semiconductor die 320 to the substrate 310 by adhesive 321, the operation of bonding conductive wires 330 to electrically connect the semiconductor die 320 to bond fingers of the substrate 310, the operation of pressing the encapsulant 340, and the operation of fusion-welding solder balls 350 to ball lands on a lower surface of the substrate 310. Further, the operation of pressing the encapsulant 340 includes the operation of attaching the supporting portion to the adhering portion and a first heating operation of heating the adhering portion to flowing state. In addition, the method of making the semiconductor package further includes a second heating operation of heating the adhering portion at a predetermined temperature in order to cure the adhering portion and the operation of removing the supporting portion from the adhering portion, after the operation of pressing the encapsulant 340.

Figure 5:
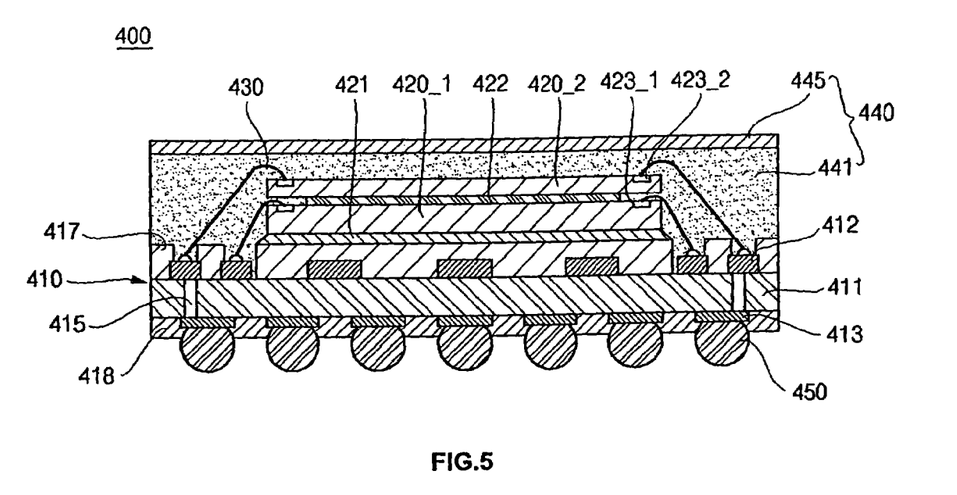
FIG. 5 is a sectional view showing a semiconductor package according to still another embodiment of the present invention.

Referring to FIG. 5, there is shown a sectional view of the semiconductor package according to still another embodiment of the present invention. As shown in FIG. 5, the semiconductor package 400 according to still another embodiment of the present invention has a structure similar to that of the semiconductor package 100 according to the embodiment shown in FIG. 1. Therefore, differences from the semiconductor package 100 shown in FIG. 1 will be described. Further, the method of making the semiconductor package 400 according to the embodiment of FIG. 5 is similar to the method of making the semiconductor package 100 according to the embodiment of FIG. 1. Therefore, differences from the method of making the semiconductor package 400 according to still another embodiment of the present invention will be described.

As shown in FIG. 5, the semiconductor package 400 according to still another embodiment of the present invention includes a plate shaped substrate 410, at least two semiconductor dies 420_1 and 420_2 attached to an upper surface of the substrate 410, a plurality of conductive wires 430 for electrically connecting the semiconductor dies 420_1 and 420_2 to the substrate 410, an encapsulant 440 for covering and protecting the conductive wires 430 from the exterior environment, and a plurality of solder balls 450 fusion-welded to a lower surface of the substrate 410 and mounted to an exterior device.

First, the substrate 410 is formed such that a plurality of conductive patterns 412 and 413 are formed on upper and lower surfaces of plate shaped thermosetting resin layer 411, while having conductive vias 415 formed therein in order to electrically connect the upper conductive patterns 412 formed on the upper surface thereof to the lower conductive patterns 413 formed on the lower surface thereof. Further, the substrate 410 includes an upper solder mask 417 covering a portion of an upper surface of the resin layer 411 and the upper conductive patterns 412, and a lower solder mask 418 covering a portion of a lower surface of the resin layer 411 and the lower conductive patterns 413. Portions of the upper conductive patterns 412 corresponding to a bond finger connected to first semiconductor die 420_1 and a bond finger connected to second semiconductor die 420_2, respectively, are separately formed and insulated.

The semiconductor die 420_1 and 420_2 are vertically stacked. The two semiconductor dies 420_1 and 420_2 are stacked as shown in FIG. 5, but it is understood that at least two semiconductor dies may be stacked. Here, the number of the semiconductor dies is not limited. The first semiconductor die 420_1 is attached to a center portion of the upper surface of the substrate 410 by adhesive 421, which has die pads 423_1 formed thereon to which the conductive wires 430 are bonded. Further, the second semiconductor die 420_2 is attached to an upper surface of the first semiconductor die 420_1 by adhesive 422. Similarly, the second semiconductor die 420_2 has die pads 423_2 formed thereon to which the conductive wires 430 are bonded. At this time, the first semiconductor die 420_1 and the second semiconductor die 420_2 may be formed to have an identical size. However, it is understood that the second semiconductor die 420_2 may have a smaller size than that of the first semiconductor die 420_1, for example, see semiconductor package 400A of FIG. 7. Referring still to FIG. 5, the semiconductor dies 420_1 and 420_2 are not limited to the above-mentioned size. The semiconductor dies 420_1 and 420_2 have die pads 423_1 and 423_2, respectively. Separate conductive wires 430 are connected to bond fingers, respectively.

The conductive wires 430 electrically connect the die pad 423_1 of the first semiconductor die 420_1 and the die pad 423_2 of the second semiconductor die 420_2 to the bond fingers of the substrate 410, respectively. At this time, the conductive wires 430 are first bonded to the bond finger in a ball bonding manner, and then are bonded to the die pad in a stitch bonding manner, respectively, as described above relating to the previous embodiments.

Next, the encapsulant 440 includes an adhering portion 441 and a supporting portion 445. The adhering portion 441 is formed of thermosetting resin having fluidity in a range of predetermined temperature. The supporting portion 445 is made of polyimide, epoxy, and the like. At this time, the encapsulant 440 is formed to cover the entire of the upper surface of the substrate 410 as shown in FIG. 5. As not shown in FIG. 5, the encapsulant 440 may be formed so that a portion of the substrate is exposed to the exterior, like the embodiment shown in FIG. 3. That is, the structure in the embodiments of FIGS. 1 and 3 are selectively applied to the embodiment of FIG. 5. Such examples are illustrated by semiconductor packages 400A, 400B of FIGS. 7, 8, where a space portion 447 is formed in encapsulant 440, but otherwise where similar elements are labeled with the same reference number.

The solder balls 450 are fusion-welded to ball lands downward exposed through a lower solder mask 418 on the lower surface of the substrate 410. The solder balls 450 play the role of electrically connecting a wire pattern of a printed circuit board to the semiconductor package 400 when the semiconductor package 400 is mounted on a surface of the printed circuit board.

As described above, the semiconductor package 400 according to still another embodiment of the present invention has at least two semiconductor dies mounted therein, so as to exhibit a more excellent performance, while having a more reduced thickness in spite of the semiconductor package in which the semiconductor dies are stacked.

Hereinafter, the method of making the semiconductor package 400 according to still another embodiment of the present invention.

The method of the semiconductor package 400 according to still another embodiment of the present invention includes the operation of attaching a second semiconductor die in addition to the method of making the semiconductor package 400 illustrated in FIGS. 2A through 2F. That is, the method of making the semiconductor package 400 according to the embodiment of FIG. 5 includes the operation of manufacturing a substrate 410, the operation of forming solder masks 417 and 418 on upper and lower surfaces of the substrate 410, the operation of attaching a first semiconductor die 420_1 to the substrate 410 by using adhesive 421, the operation of attaching a second semiconductor die 420_2 to an upper surface of the first semiconductor die 420_1 by using adhesive 422, the operation of electrically connecting the semiconductor dies 420_1 and 420_2 to bond fingers of the substrate 410 by means of conductive wires 430, respectively, the operation of pressing an encapsulant 440, and the operation of fusion-welding solder balls 450 to ball lands on a lower surface of the substrate 410. Meanwhile, the operation of pressing the encapsulant 440 is performed after the operation of attaching a supporting portion 445 to an adhering portion 441, and a first heating operation of heating the adhering portion 441 in flowing state. The method of making the semiconductor package further includes a second heating operation of heating the pressed adhering portion 441 to a predetermined temperature so as to cure the adhering portion 441, after the operation of pressing the encapsulant 440.

Figure 6A:
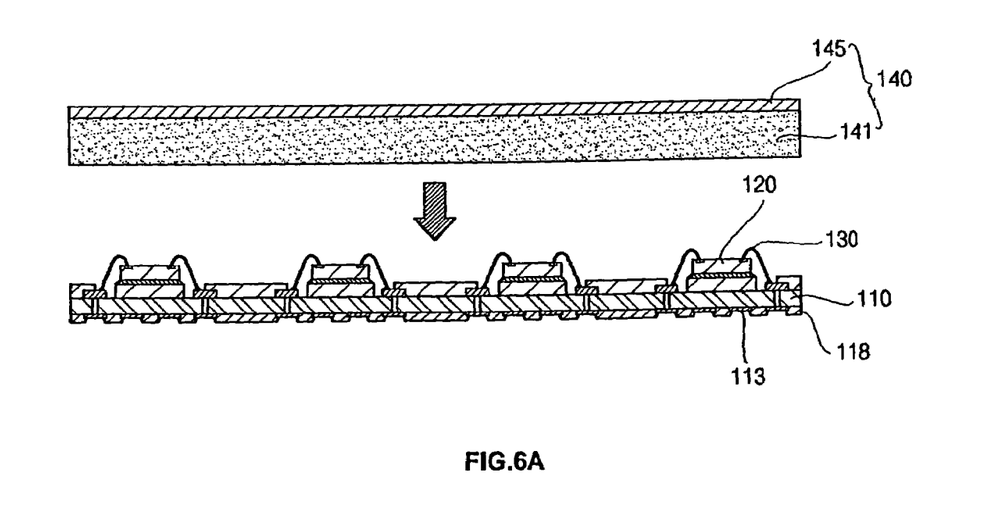
FIGS. 6A through 6C are sectional views illustrating a gang process of the semiconductor package according to the embodiment of the present invention in FIG. 1.
Figure 6B:
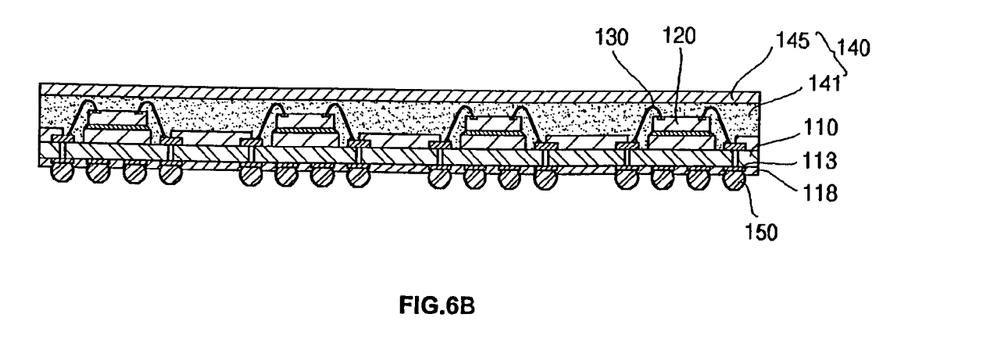
Figure 6C:
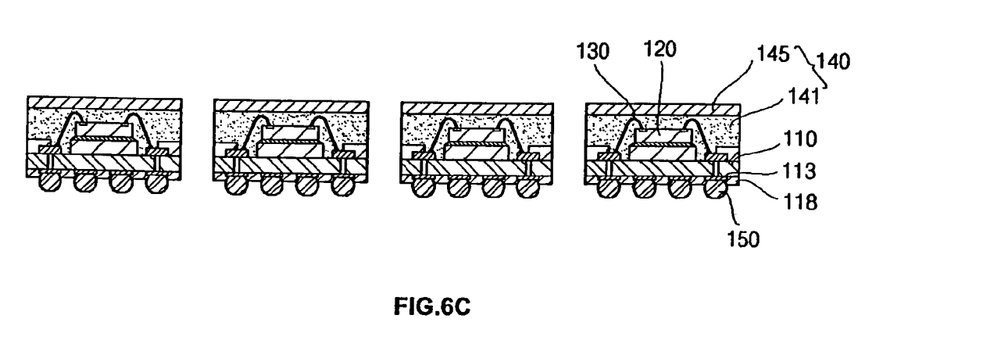

Referring to FIGS. 6A through 6C, there is shown a sectional view illustrating a gang process for the semiconductor package according to the embodiment of FIG. 1. Though not shown, the embodiments of FIGS. 3 and 5 can be manufactured by a method similar to the gang process for the semiconductor package according to the embodiment of FIG. 1. Furthermore, since the method of manufacturing a unit is described in detail with reference to FIGS. 2A through 2F, the method of making the semiconductor package based on the gang process will be described in brief, hereinafter.

As shown in FIGS. 6A, 6B, 6C, the gang process for the semiconductor package 100 according to the embodiment of FIG. 1 includes the operation of preparing encapsulant 140, the operation of pressing the encapsulant 140, the operation of fusion-welding solder balls, and a singulation operation of sawing the semiconductor package in each unit.

Referring to FIG. 6A, first, there is shown the operation of preparing encapsulant 140. The operation of preparing the encapsulant 140 includes the operation of bonding conductive wires 130 to the semiconductor die 120 and the substrate 110 in a wire bonding manner after a plurality of semiconductor dies 120 is arranged in line, in a row, or in matrix on a large area of substrate 110, and the operation of attaching a supporting portion 145 to an adhering portion 141 and heating the adhering portion to have fluidity. At this time, it is mentioned above that the adhering portion 141 is adjusted to have a minimal thickness, while enclosing the entire upper portion of the substrate 110 so that empty space is not formed at both sides of the semiconductor package.

Referring to FIG. 6B next, there is shown a sectional view illustrating the operations of pressing the encapsulant 140 and fusion-welding solder balls 150.

The operation of pressing the encapsulant 140 includes the operation of vertically pressing the adhering portion 141 in gel having fluidity, and the operation of heating the adhering portion 141 over a predetermined temperature so as to cure the adhering portion 141. At this time, in the operation of pressing the encapsulant 140, there are required for heat over a predetermined temperature and enough pressure to make the thickness of the semiconductor package be minimal.

In the operation of fusion-welding the solder balls 150, the solder balls 150 are fusion-welded to the lower conductive pattern 113 exposed to the exterior because the lower solder mask 118 is not formed on the lower conductive pattern 113.

Referring next to FIG. 6C, there is shown a sectional view illustrating the singulation operation.

In the singulation operation, the semiconductor package is sawed from the encapsulant 140 to the lower surface of the substrate 110 in each unit, in order to satisfy a standard for unit. When the singulation operation is finished, a plurality of units is produced.

Figure 7:
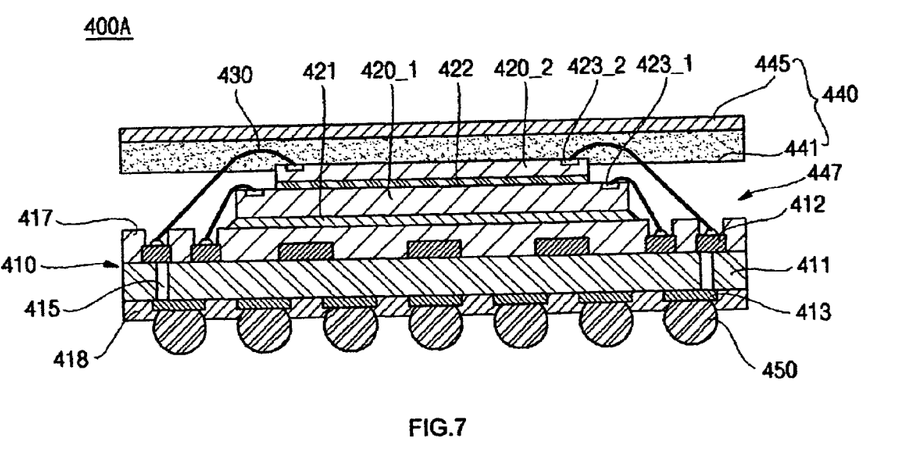
FIGS. 7, 8, 9 and 10 are sectional views showing semiconductor packages according to other embodiments of the present invention.

Referring to FIG. 7, there is shown a sectional view of the semiconductor package according to still another embodiment of the present invention. As shown in FIG. 7, the semiconductor package 400A according to still another embodiment of the present invention has a structure similar to that of the semiconductor package 400 according to the embodiment shown in FIG. 5. Therefore, differences from the semiconductor package 400 shown in FIG. 5 will be described.

As shown in FIG. 7, the second semiconductor die 420_2 is of a smaller size than that of the first semiconductor die 420_1. More particularly, the second semiconductor die 420_2 is attached to an upper surface of the first semiconductor die 420_1 inward of the die pads 423_1 of the first semiconductor die 420_1 by adhesive 422.

As also shown in FIG. 7, the semiconductor package 400A according to still another embodiment of the present invention includes an encapsulant 440. The encapsulant 440 includes an adhering portion 441 and a supporting portion 445. The adhering portion 441 is formed of thermosetting resin having fluidity at a predetermined temperature range, while the supporting portion 445 is formed of polyimide, epoxy, or the equivalent materials thereof. At this time, the encapsulant 440 is formed to cover at least a part of the semiconductor die 420_2 and the conductive wires 430 attached to the semiconductor die 420_2 so that a part of the upper surface of the substrate 410 and the semiconductor die 420_1 are exposed to the exterior. In other words, the encapsulant 440 is downward pressed over the upper surface of the semiconductor die 420_2 and at least a part of the conductive wires 430 attached thereto, in order to enclose the upper surface of the semiconductor die 420_2 and an upper portion of the conductive wires 430 attached thereto. Therefore, a portion of the semiconductor package 400A is not enclosed by the encapsulant 440 to have empty space portion 447. The space portion 447 may be filled with epoxy molding compound by a separate encapsulation process or remain empty, after the semiconductor package 400A is mounted on a printed circuit board.

Figure 8:
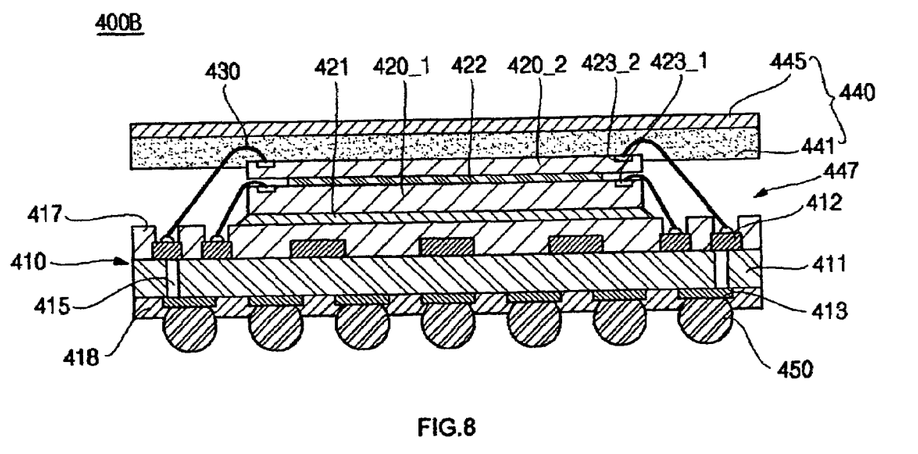

Referring to FIG. 8, there is shown a sectional view of the semiconductor package according to still another embodiment of the present invention. As shown in FIG. 8, the semiconductor package 400B according to still another embodiment of the present invention has a structure similar to that of the semiconductor package 400 according to the embodiment shown in FIG. 5. Therefore, differences from the semiconductor package 400 shown in FIG. 5 will be described.

As shown in FIG. 8, the semiconductor package 400B according to still another embodiment of the present invention includes an encapsulant 440. The encapsulant 440 includes an adhering portion 441 and a supporting portion 445. The adhering portion 441 is formed of thermosetting resin having fluidity at a predetermined temperature range, while the supporting portion 445 is formed of polyimide, epoxy, or the equivalent materials thereof. At this time, the encapsulant 440 is formed to cover the semiconductor die 420_2 and the conductive wires 430 attached to the semiconductor die 420_2 so that a part of the upper surface of the substrate 410 and the semiconductor die 420_1 are exposed to the exterior. In other words, the encapsulant 440 is downward pressed over the upper surface of the semiconductor die 420_2 and the conductive wires 430 attached thereto, in order to enclose the upper surface of the semiconductor die 420_2 and an upper portion of the conductive wires 430 attached thereto. Therefore, a portion of the semiconductor package 400B is not enclosed by the encapsulant 440 to have empty space portion 447. The space portion 447 may be filled with epoxy molding compound by a separate encapsulation process or remain empty, after the semiconductor package 400B is mounted on a printed circuit board.

Figure 9:
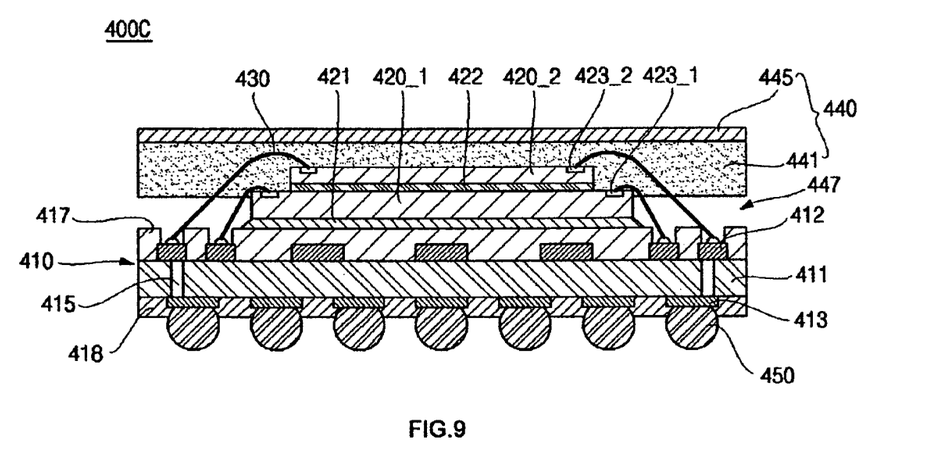

Referring to FIG. 9, there is shown a sectional view of the semiconductor package according to still another embodiment of the present invention. As shown in FIG. 9, the semiconductor package 400C according to still another embodiment of the present invention has a structure similar to that of the semiconductor package 400A according to the embodiment shown in FIG. 7. Therefore, differences from the semiconductor package 400A shown in FIG. 7 will be described.

As shown in FIG. 9, the semiconductor package 400C according to still another embodiment of the present invention includes an encapsulant 440. The encapsulant 440 includes an adhering portion 441 and a supporting portion 445. The adhering portion 441 is formed of thermosetting resin having fluidity at a predetermined temperature range, while the supporting portion 445 is formed of polyimide, epoxy, or the equivalent materials thereof. At this time, the encapsulant 440 is formed to cover the semiconductor dies 420_1, 420_2 and the conductive wires 430 attached to the die pads 423_2, 423_1 so that a part of the upper surface of the substrate 410 is exposed to the exterior. In other words, the encapsulant 440 is downward pressed over the entire semiconductor die 420_2 and the upper surface of the semiconductor die 420_1 and the conductive wires 430, in order to enclose the entire semiconductor die 420_2, the upper surface of the semiconductor die 420_1, and an upper portion of the conductive wires 430. Therefore, a portion of the semiconductor package 400C is not enclosed by the encapsulant 440 to have empty space portion 447.

The space portion 447 may be filled with epoxy molding compound by a separate encapsulation process or remain empty, after the semiconductor package 400C is mounted on a printed circuit board. In a case where the space portion 447 is filled with the epoxy molding compound, the space portion 447 is filled with the epoxy molding compound in the transfer molding manner. At this time, since the adhering portion 441 secures the upper portion of the conductive wires 430, there is no danger that the wire sweeping occurs although the epoxy molding compound is filled in the space portion.

Figure 10:
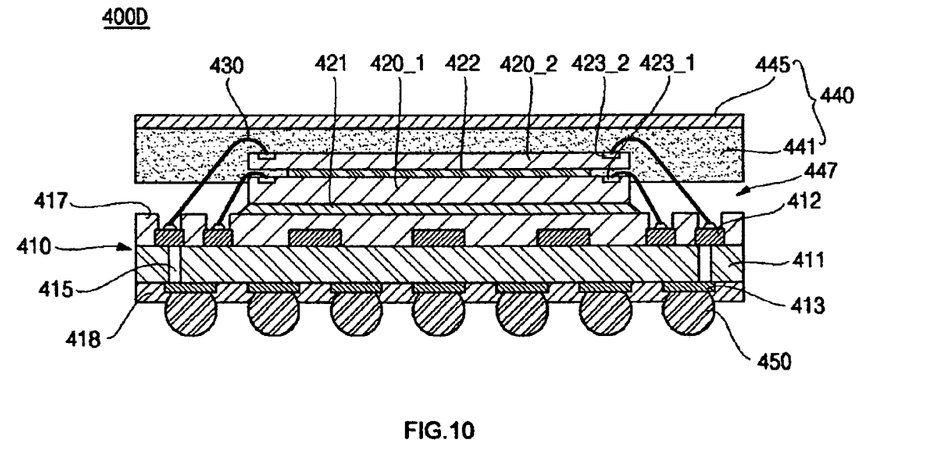

Referring to FIG. 10, there is shown a sectional view of the semiconductor package according to still another embodiment of the present invention. As shown in FIG. 10, the semiconductor package 400D according to still another embodiment of the present invention has a structure similar to that of the semiconductor package 400B according to the embodiment shown in FIG. 8. Therefore, differences from the semiconductor package 400B shown in FIG. 8 will be described.

As shown in FIG. 10, the semiconductor package 400D according to still another embodiment of the present invention includes an encapsulant 440. The encapsulant 440 includes an adhering portion 441 and a supporting portion 445. The adhering portion 441 is formed of thermosetting resin having fluidity at a predetermined temperature range, while the supporting portion 445 is formed of polyimide, epoxy, or the equivalent materials thereof. At this time, the encapsulant 440 is formed to cover the semiconductor dies 420_1, 420_2 and the conductive wires 430 attached to the die pads 423_2, 423_1 so that a part of the upper surface of the substrate 410 is exposed to the exterior. In other words, the encapsulant 440 is downward pressed over the entire semiconductor die 420_2 and the upper surface of the semiconductor die 420_1 and the conductive wires 430, in order to enclose the entire semiconductor die 420_2, the upper surface of the semiconductor die 420_1, and an upper portion of the conductive wires 430. Therefore, a portion of the semiconductor package 400D is not enclosed by the encapsulant 440 to have empty space portion 447.

The space portion 447 may be filled with epoxy molding compound by a separate encapsulation process or remain empty, after the semiconductor package 400D is mounted on a printed circuit board. In a case where the space portion 447 is filled with the epoxy molding compound, the space portion 447 is filled with the epoxy molding compound in the transfer molding manner. At this time, since the adhering portion 441 secures the upper portion of the conductive wires 430, there is no danger that the wire sweeping occurs although the epoxy molding compound is filled in the space portion.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
   a substrate, which has a plurality of conductive patterns formed on upper and lower surfaces of the substrate and a solder mask layer formed on the lower surface of the substrate;
   a semiconductor die adhered by adhesive to the upper surface of the substrate;
   a plurality of conductive wires for electrically connecting die pads on an upper surface of the semiconductor die to bond fingers on the upper surface of the substrate;
   encapsulant pressed downward over an upper portion of the semiconductor die so as to cover the semiconductor die placed on the upper surface of the substrate and the conductive wires, wherein the encapsulant covers only a first part of the semiconductor die and only a first part of the conductive wires leaving a second part of the semiconductor die and a second part of the conductive wires exposed to an exterior of the semiconductor package through a space portion existing at a side of the semiconductor package, wherein the first part of the conductive wires comprises the entire upper portion of the conductive wires above a plane defined by the upper surface of the semiconductor die; and
   a plurality of solder balls fusion-welded to the conductive pattern formed on the lower surface of the substrate.

2. The semiconductor package as claimed in claim 1, wherein the encapsulant includes an adhering portion made of thermosetting resin having fluidity in a predetermined temperature range.

3. The semiconductor package as claimed in claim 1, further comprising a second semiconductor die adhered to the upper surface of the semiconductor die, wherein the encapsulant covers at least a part of the second semiconductor die.

4. The semiconductor package as claimed in claim 3, wherein the encapsulant covers the entire second semiconductor die and the upper surface of the semiconductor die.

5. The semiconductor package as claimed in claim 3, wherein the second semiconductor die is smaller than the semiconductor die.

6. The semiconductor package as claimed in claim 2, wherein the encapsulant includes a supporting portion that is located on an upper surface of the adhering portion so as to support the adhering portion.

7. The semiconductor package as claimed in claim 1, wherein at least one semiconductor die is stacked.

8. The semiconductor package as claimed in claim 1, wherein the conductive wires have one end bonded to the die pads in a stitch bonding manner and the other end attached to the bond fingers in a ball bonding manner.

9. A semiconductor package comprising:
a substrate;
a semiconductor die coupled to an upper surface of the substrate;
conductive wires electrically connecting die pads on an upper surface of the semiconductor die to bond fingers on the upper surface of the substrate;
an encapsulant covering the semiconductor die and the conductive wires, wherein the encapsulant covers only a first part of the semiconductor die and only a first part of the conductive wires leaving a second part of the semiconductor die and a second part of the conductive wires exposed to an exterior of the semiconductor package through a space portion existing at a side of the semiconductor package, wherein the first part of the semiconductor die comprises the upper surface of the semiconductor die and an upper portion of sides of the semiconductor die, wherein the second part of the semiconductor die comprises a lower portion of the sides of the semiconductor die, the encapsulant comprising:
an adhering portion made of thermosetting resin having fluidity in a predetermined temperature range; and
a supporting portion that is located on an upper surface of the adhering portion, the supporting portion supporting the adhering portion, the supporting portion having a lower surface with a total area identical with the total area of the upper surface of the adhering portion, the supporting portion being selected from the group consisting of polyimide and epoxy.

10. The semiconductor package as claimed in claim 9, further comprising a second semiconductor die adhered to the upper surface of the semiconductor die, wherein the encapsulant covers the second semiconductor die.

11. The semiconductor package as claimed in claim 10, wherein the encapsulant covers the entire second semiconductor die and the upper surface of the semiconductor die.

12. The semiconductor package as claimed in claim 10, wherein the second semiconductor die is smaller than the semiconductor die.

13. The semiconductor package as claimed in claim 12, wherein the second semiconductor die is adhered to the upper surface of the semiconductor die inward of the die pads.

14. The semiconductor package as claimed in claim 9, wherein the conductive wires have one end bonded to the die pads in a stitch bonding manner and the other end attached to the bond fingers in a ball bonding manner.

15. A semiconductor package comprising:
a substrate;
a semiconductor die coupled to an upper surface of the substrate;
a second semiconductor die coupled to an upper surface of the semiconductor die;
conductive wires electrically connecting die pads of the semiconductor die and the second semiconductor die to bond fingers on the upper surface of the substrate;
an encapsulant covering at least a part of the second semiconductor die, wherein the encapsulant covers only a first part of the second semiconductor die leaving a second part of the second semiconductor die and the semiconductor die exposed to an exterior of the semiconductor package through a space portion existing at a side of the semiconductor package, wherein the first part of the second semiconductor die comprises an upper surface of the second semiconductor die and an upper portion of sides of the second semiconductor die, wherein the second part of the second semiconductor die comprises a lower portion of the sides of the second semiconductor die, the encapsulant comprising:
an adhering portion made of thermosetting resin having fluidity in a predetermined temperature range; and
a supporting portion that is located on an upper surface of the adhering portion, the supporting portion supporting the adhering portion, the supporting portion having a lower surface with a total area identical with the total area of the upper surface of the adhering portion, the supporting portion being selected from the group consisting of polyimide and epoxy.

* * * * *